(12) United States Patent
Hovel

(10) Patent No.: US 8,853,524 B2
(45) Date of Patent: Oct. 7, 2014

(54) SILICON SOLAR CELL WITH BACK SURFACE FIELD

(75) Inventor: Harold John Hovel, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 13/253,467

(22) Filed: Oct. 5, 2011

(65) Prior Publication Data

US 2013/0087195 A1 Apr. 11, 2013

(51) Int. Cl.
*H01L 31/18* (2006.01)
*H01L 21/02* (2006.01)
*H01L 21/225* (2006.01)

(52) U.S. Cl.
CPC ........... *H01L 31/18* (2013.01); *H01L 21/02535* (2013.01); *H01L 21/02667* (2013.01); *H01L 21/02381* (2013.01); *H01L 21/2257* (2013.01)
USPC ............... 136/251; 136/252; 438/71; 438/72; 438/96; 438/97

(58) Field of Classification Search
USPC ................... 136/261, 252; 438/71, 72, 96, 97
See application file for complete search history.

(56) References Cited

U.S. PATENT DOCUMENTS

| | | | |
|---|---|---|---|
| 5,627,081 | A | 5/1997 | Tsuo et al. |
| 6,165,875 | A | 12/2000 | Fonash et al. |
| 6,927,417 | B2 * | 8/2005 | Nagashima et al. ............ 257/55 |
| 7,449,397 | B2 | 11/2008 | Ro et al. |
| 7,507,648 | B2 | 3/2009 | Kakkad |
| 7,592,198 | B2 | 9/2009 | Huet et al. |
| 7,863,075 | B2 | 1/2011 | Jang et al. |
| 2005/0150543 | A1 * | 7/2005 | Nakashima et al. .......... 136/256 |
| 2007/0169808 | A1 * | 7/2007 | Kherani et al. ............... 136/258 |
| 2010/0227431 | A1 | 9/2010 | Rana |
| 2011/0056550 | A1 | 3/2011 | Choi et al. |
| 2011/0061732 | A1 | 3/2011 | Yang et al. |

FOREIGN PATENT DOCUMENTS

WO WO 2010151478 A1 12/2010

OTHER PUBLICATIONS

T. Matsuyama et al.; Preparation of High-Quality n-Type Poly-Si Films by the Solid Phase Crystallization (SPC) Method; Jpn. J. Appl. Phys. vol. 29, 1990, pp. 2327-2331.
M. L. Terry et al.; Large Open-Circuit Voltage Improvement by Rapid Thermal Annealing of Evaporated Solid-Phase-Crystallized Thin-Film Silicon Solar Cells on Glass; Appl. Phys. Lett. vol. 86, 2005, 172108.
S. Y. Yoon et al.; Low Temperature Solid Phase Crystallization of Amorphous Silicon at 380° C.; J. Appl. Phys., vol. 84, 1998, pp. 6463-6465.
J. F. Nijs et al.; Advanced Manufacturing Concepts for Crystalline Silicon Solar Cells; IEEE Transactions on Electron Devices, vol. 46, Issue:10, Oct. 1999, pp. 1948-1969.

* cited by examiner

*Primary Examiner* — Golam Mowla
(74) *Attorney, Agent, or Firm* — Joseph P. Abate; Howard M. Cohn

(57) ABSTRACT

A solar cell and method of fabrication are disclosed. In one embodiment of the present invention, the method comprises depositing a first doped amorphous silicon layer on a first surface of a silicon substrate, depositing a second doped amorphous silicon layer on the first surface of the silicon substrate. The second doped amorphous silicon layer is doped oppositely from the first doped amorphous silicon layer. An anneal is performed to transform the first doped amorphous silicon layer and second doped amorphous silicon layer to crystalline silicon layers.

14 Claims, 9 Drawing Sheets

SILICON SOLAR CELL WITH BACK SURFACE FIELD

FIELD OF THE INVENTION

The present invention relates generally to semiconductor fabrication, and more particularly to the fabrication of silicon solar cells.

BACKGROUND OF THE INVENTION

High performance silicon (Si) solar cells employ a primary junction where the main voltage output is generated and a secondary junction which minimizes recombination of minority carriers. In most solar cells the secondary junction is located at the back surface and has the acronym BSF for Back Surface Field. These junctions can be created by diffusion, ion implantation, or epitaxy. Ion implantation is an expensive process not generally used in manufacturing of solar cells. Epitaxy has the advantage that the thickness and doping level can be controlled as desired and are separate. However, epitaxy is expensive and slow, requiring expensive equipment and consumables. Diffusion is most often used and is the least costly; however, diffusion requires both high temperatures and long times, and it is difficult to control junction depth and carrier concentration independently. Boron is most often used as the p-dopant for the BSF, but requires even higher temperatures, in excess of 1000 degrees C. for long times, to obtain the desired deep junction with low peak doping level. This adds to the cost, the energy balance (quantity of energy needed to make the cell versus energy returned in operation), and the time needed to manufacture cells.

The cost and environmental impact of fossil fuels is becoming a greater worldwide concern. Therefore, it is desirable to have an improved solar cell to provide a more efficient source of clean energy.

SUMMARY OF THE INVENTION

In one embodiment of the present invention, a method of fabricating a solar cell is provided. The method comprises depositing a first doped amorphous silicon layer on a region of a first surface of a silicon substrate, depositing a second doped amorphous silicon layer on a different region of the first surface of the silicon substrate, wherein the second doped amorphous silicon layer is doped oppositely from the first doped amorphous silicon layer, and performing an anneal to transform the first doped amorphous silicon layer and second doped amorphous silicon layer to crystalline silicon layers.

In another embodiment of the present invention, a solar cell is provided, The solar cell comprises a silicon substrate comprising a front surface and a back surface, an alternating pattern of n-type crystalline silicon regions and p-type crystalline silicon regions disposed on the back surface of the silicon substrate, wherein each n-type crystalline silicon region is separated from each p-type crystalline silicon region by a space, a passivation layer disposed on the front surface of the silicon substrate, and one or more antireflecting layers disposed on the passivation layer.

In another embodiment, another solar cell is provided. This solar cell comprises a silicon substrate comprising a front surface and a back surface, an alternating pattern of n-type crystalline silicon regions and p-type crystalline silicon regions disposed on the back surface of the silicon substrate, wherein each n-type crystalline silicon region is separated from a p-type crystalline silicon region by a space, an amorphous n-type silicon layer disposed on the front surface of the silicon substrate, and wherein each region in the alternating pattern of n-type crystalline silicon regions and p-type crystalline silicon regions is comprised of polycrystalline silicon.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a starting point for fabricating an embodiment of the present invention.

FIG. 2 shows an intermediate step for fabricating an embodiment of the present invention where N-type silicon is deposited.

FIG. 3 shows an intermediate step for fabricating an embodiment of the present invention where a second mask is applied.

FIG. 4 shows an intermediate step for fabricating an embodiment of the present invention where P-type silicon is deposited.

FIG. 5 shows a completed embodiment of the present invention.

FIG. 5A shows an alternative embodiment of the present invention.

FIG. 6 shows another alternative embodiment of the present invention.

FIG. 6A shows another alternative embodiment of the present invention.

FIG. 7 shows another alternative embodiment of the present invention.

FIG. 8 is a flowchart indicating process steps for an embodiment of the present invention.

FIG. 9 is a flowchart indicating process steps for an alternative embodiment of the present invention.

Figure 10:
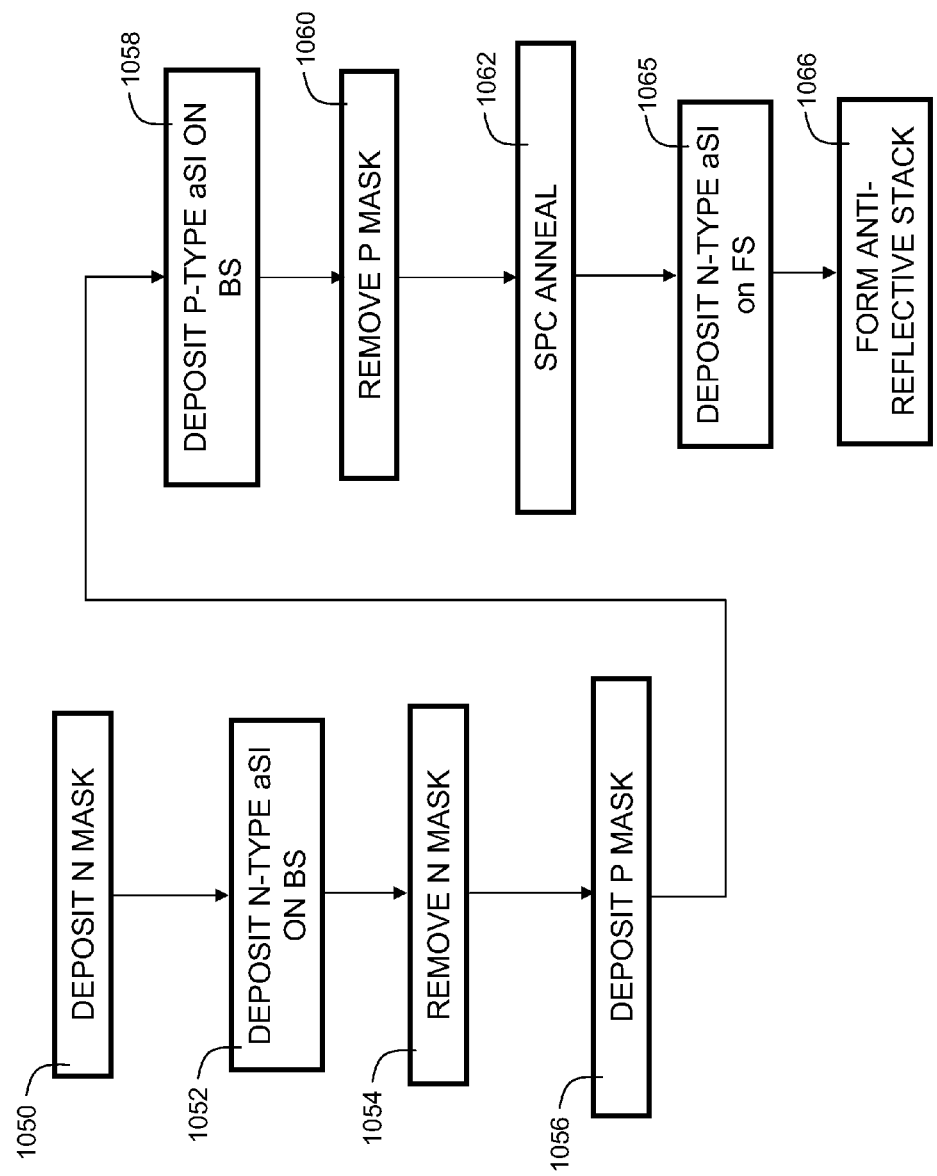

FIG. 10 is a flowchart indicating process steps for another alternative embodiment of the present invention.

Figure 11:
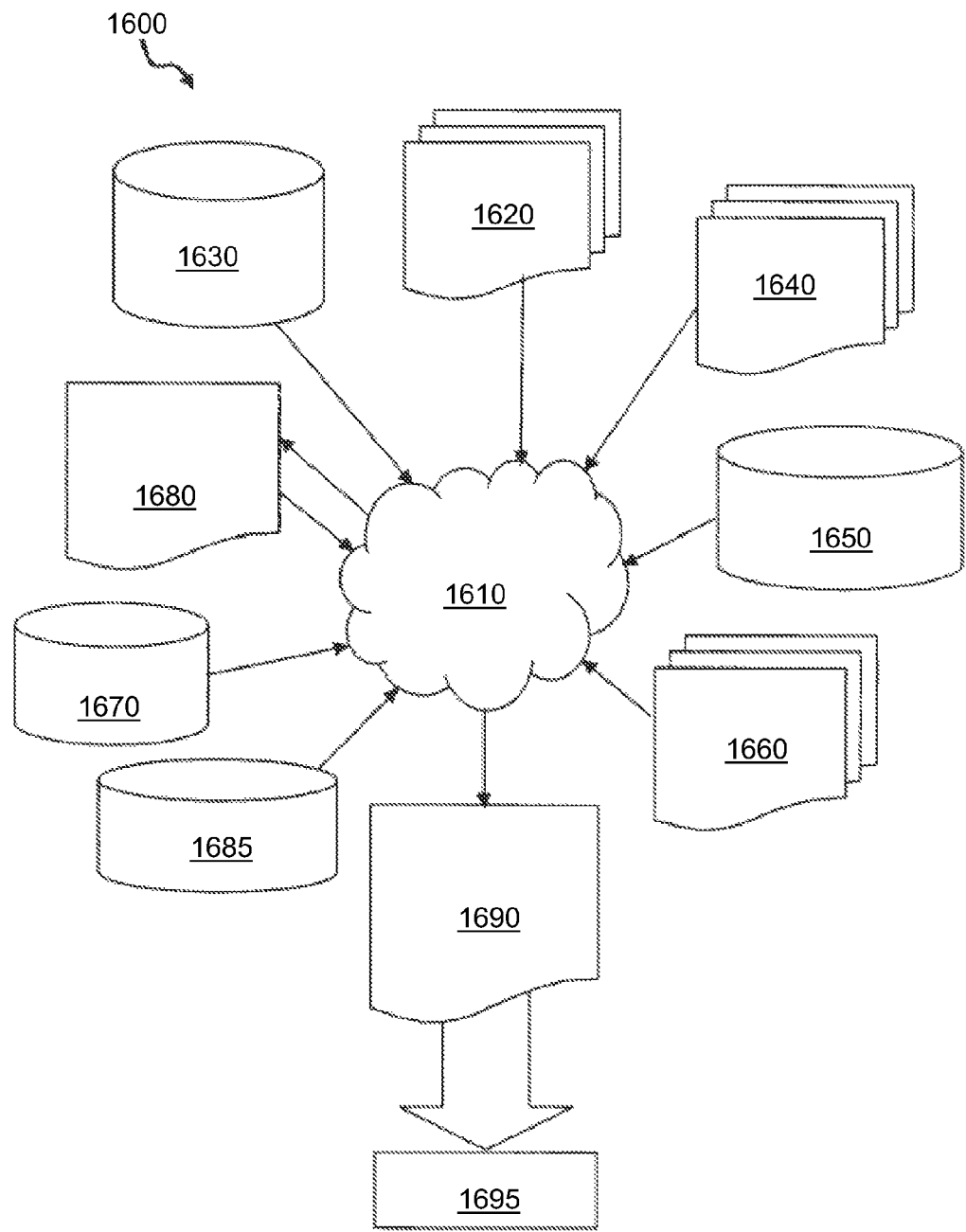

FIG. 11 shows a block diagram of an exemplary design flow.

DETAILED DESCRIPTION

Figure 1:
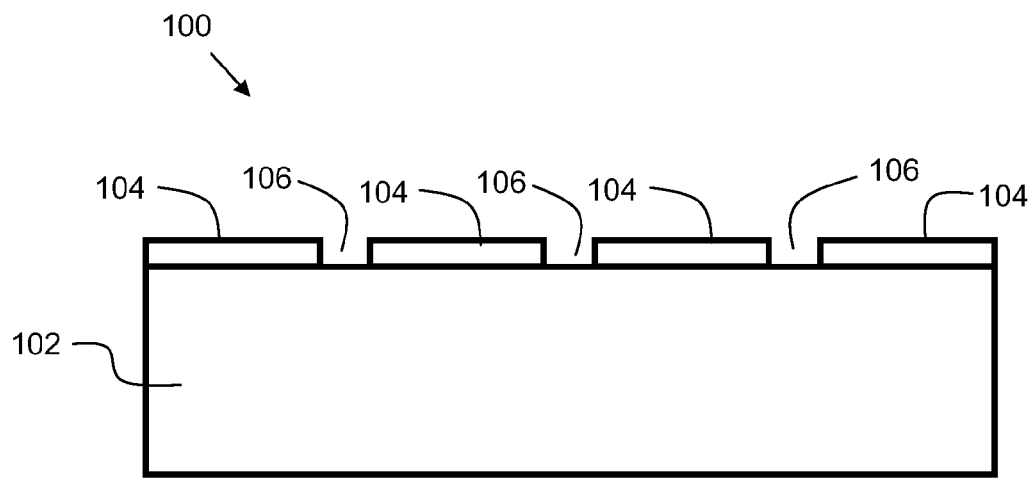

FIG. 1 shows a starting point for fabricating an embodiment of the present invention. Structure 100 comprises silicon substrate 102, also referred to as a "bulk silicon substrate." The substrate 102 may be either n-type or p-type. Photomask 104 is deposited on to the surface of silicon substrate 102 with a pattern that comprises voids 106 within the photomask 104.

Figure 2:
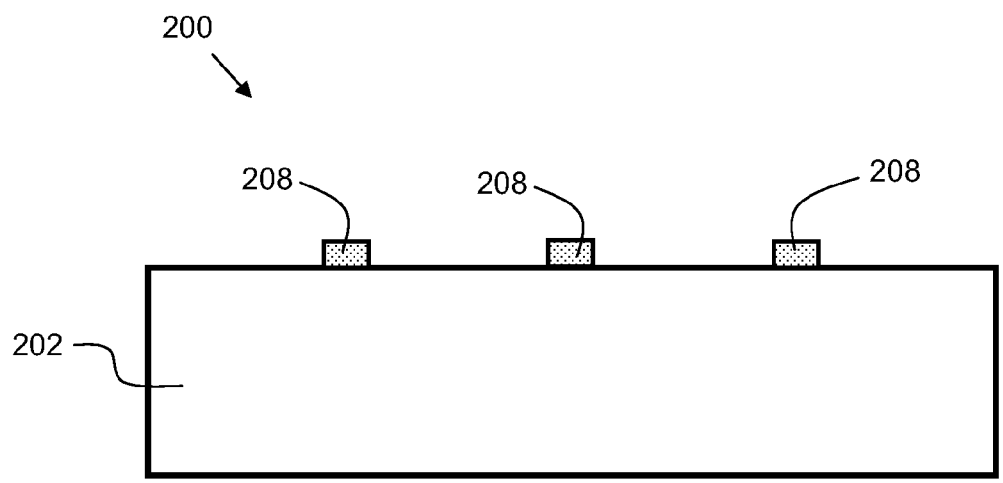

FIG. 2 shows an intermediate step for fabricating an embodiment of the present invention where N-type silicon 208 is deposited on substrate 202. The regions 208 are formed in the voids 106 that are shown in FIG. 1. N-type silicon 208 is in an amorphous state. Silicon 208 may be deposited by a variety of methods, including, but not limited to, plasma-enhanced chemical vapor deposition (PECVD), CVD, evaporation, and sputtering.

Figure 3:
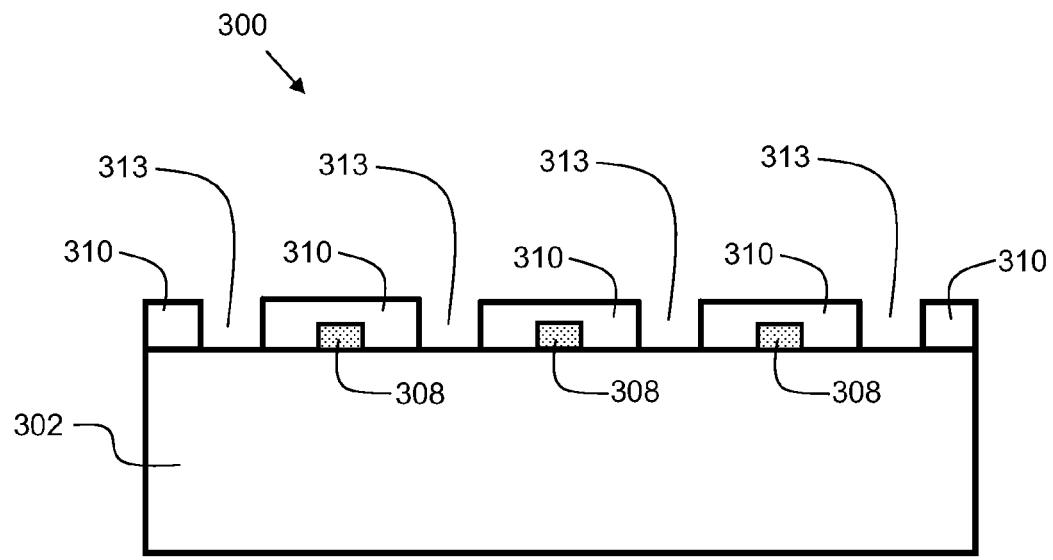

FIG. 3 shows an intermediate step for fabricating an embodiment of the present invention where a second photomask 310 is applied on the surface of substrate 302 with a pattern that comprises voids 313 within the photomask 310.

Figure 4:
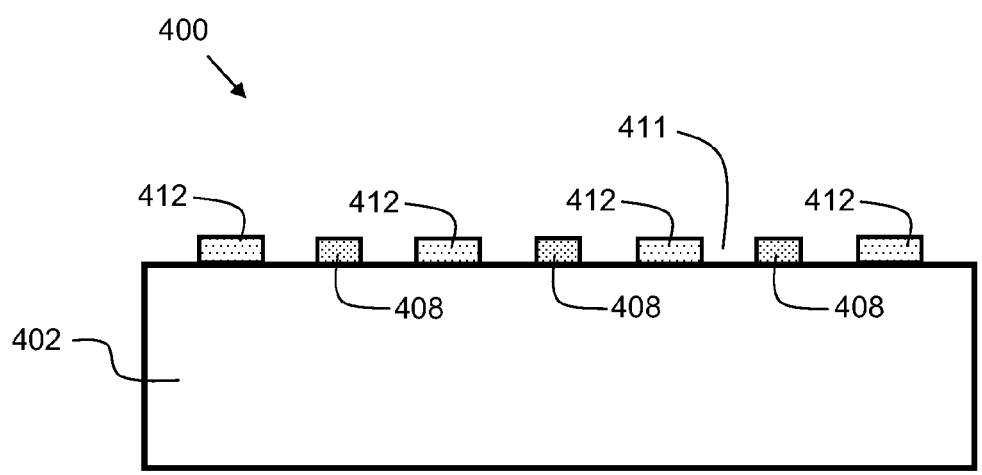

FIG. 4 shows an intermediate step for fabricating an embodiment of the present invention where P-type silicon 412 is deposited in the voids 313 shown in FIG. 3. P-type silicon 412 is in an amorphous state. At this stage, there is now an alternating pattern of oppositely doped regions (n-type silicon 408 and p-type silicon 412), wherein each region is separated by a space (indicated generally by reference number 411) from neighboring regions. Silicon regions 412 may be deposited by a variety of methods, including, but not limited to, plasma enhanced chemical vapor deposition (PECVD), CVD, evaporation, and sputtering.

Figure 5:
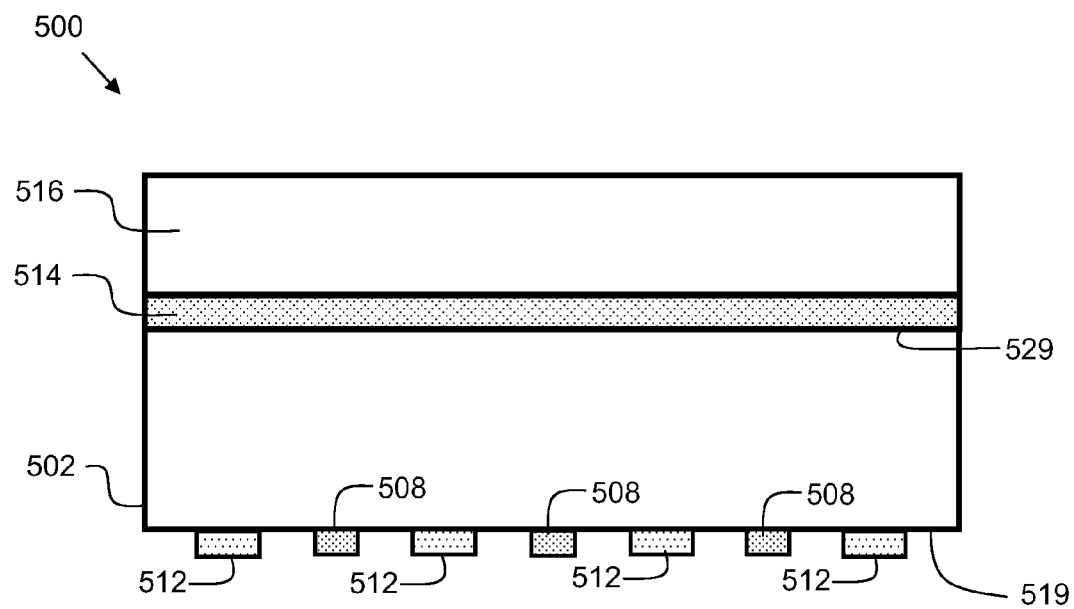

FIG. 5 shows a completed embodiment of solar cell 500. An SPC anneal is performed to induce solid phase crystallization (SPC) on the silicon regions to transform them from amorphous silicon regions to crystalline silicon regions, and crystallization proceeds with the substrate 502 acting as a "seed." Hence, the regions 408 and 412 of FIG. 4 are amorphous, and regions 508 and 512 of FIG. 5 are crystalline. Regions 508 and 512 are disposed on back surface 519 of silicon substrate 502 in an alternating, or "interdigitated" pattern. Surface 529 is referred to as the front surface of the silicon substrate 502. Note that regions 508 and 512 may be single crystal (mono-crystalline silicon) or polycrystalline.

The solar cell is inverted (compare with 400 of FIG. 4) and a passivation layer 514 is formed on the opposite surface of the N-type silicon regions 508 and P-type silicon regions 512. N-type regions 508 form the emitter of the solar cell 500 if the substrate 502 is p-type and form the base contact if substrate 502 is n-type. Equivalently, p-type regions 512 form the emitter of the solar cell 500 if the substrate 502 is n-type and form the base contact if the substrate 502 is p-type. The n-type regions 508 and p-type regions 512 may have a thickness in the range of about 0.1 microns to about 2.0 microns, and a doping level on the order of 5E18 cm-3 to 1E20 cm-3, with a more preferred doping level of 1E19 cm-3 to 2E19 cm-3. The passivation layer 514 may be comprised of SiN, Al2O3, or SiO2.

The layer 514 may be formed by oxidation, or by deposition. In one embodiment, deposition is performed with chemical vapor deposition (CVD). Optionally, an antireflective coating stack 516 comprised of one or more dielectric films may be deposited. In one embodiment, the antireflective coating stack 516 may be comprised of layers of titanium oxide and/or silicon oxide. Solar cell 500 may then be mounted to a transparent substrate (not shown) such as glass, quartz, silica, or the like, for forming a photovoltaic panel.

Figure 5A:
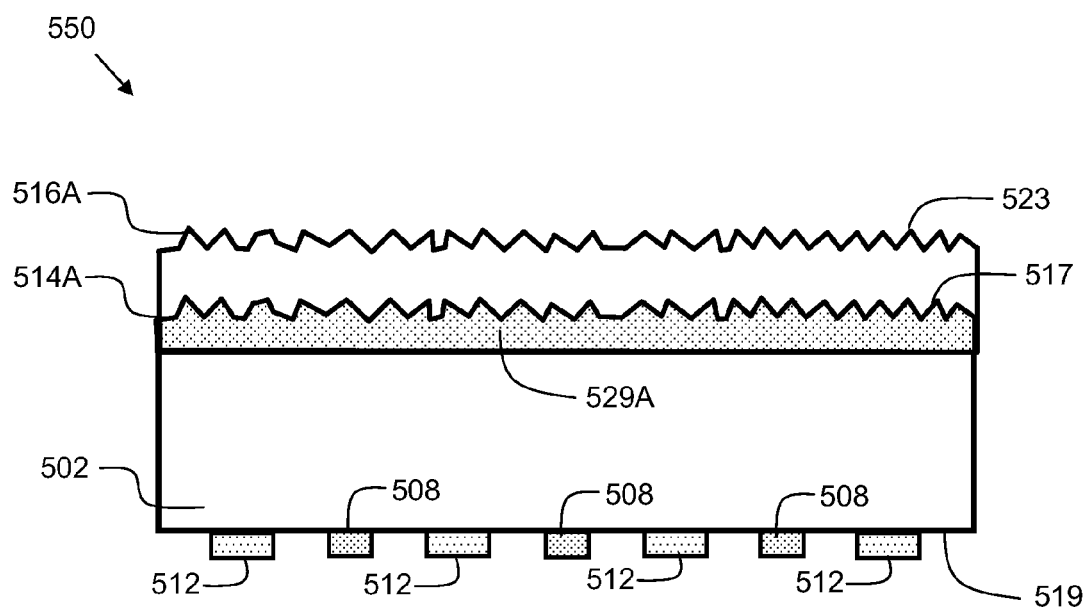

FIG. 5A shows a completed embodiment of solar cell 550. Solar cell 550 is similar to solar cell 500, except that front surface 517 of passivation layer 514A is textured. Texturing is a process where the surface is roughened to reduce reflection. It may be performed by chemical etching or plasma etching, although other schemes can also be used. It is particularly useful in thinner cells because it also results in "light trapping" which makes the light which gets into the cell reflect at an angle to improve the probability of the light being absorbed. In one embodiment, the roughened surface has deviations ranging from about 0.5 microns to about 5 microns on front surface 529A. The subsequent antireflective coating stack 516A is also formed with a roughened surface 523.

Figure 6:
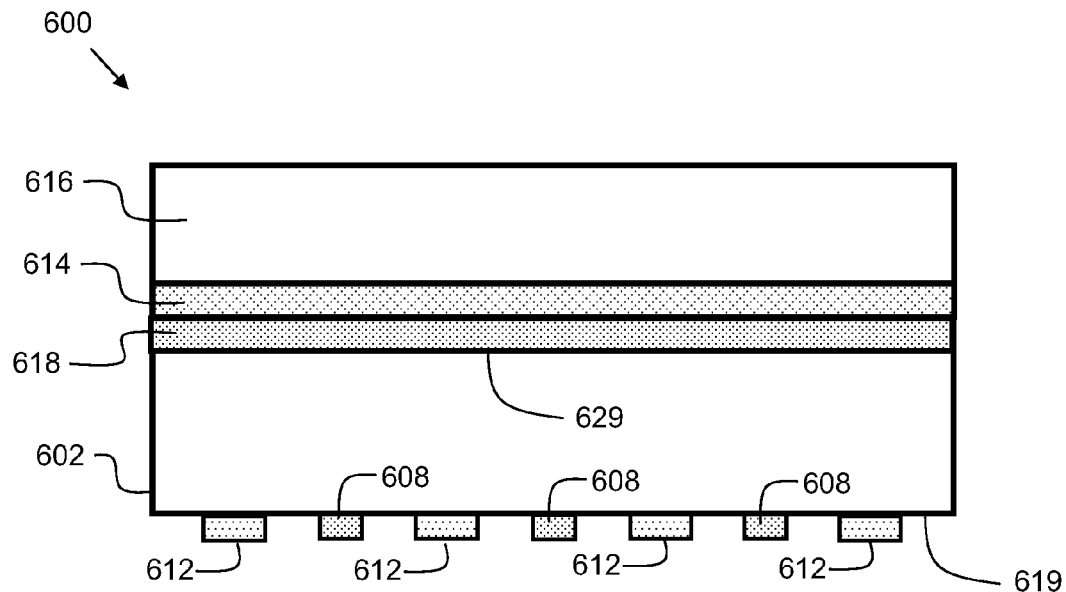

FIG. 6 shows an alternative embodiment of the present invention, showing solar cell 600. Solar cell 600 is similar to solar cell 500 (FIG. 5), with the main difference being that amorphous region 618 is deposited on the front surface 629 of substrate 602 prior to annealing. After the SPC anneal step, region 618 becomes crystalline due to the solid phase crystallization process, along with regions 608 and 612. For n-type substrates 602, amorphous region 618 is deposited with p-type doping. For p-type substrates 602, amorphous region 618 is deposited with n-type doping. Region 618 serves as a "front surface field" to reduce losses (e.g. due to recombination) that would otherwise take place at the front surface. Passivation layer 614 is then formed on top of region 618.

In one embodiment, the SPC anneal is performed at a temperature in the range of about 575 degrees Celsius to about 900 degrees Celsius. The anneal time may be a duration in the range of about 60 seconds at 900 degrees Celsius, to about 60 minutes at about 575 degrees Celsius. The SPC anneal temperature is high enough to allow crystallization to occur, while being low enough to prevent any significant diffusion of dopants from occurring.

Figure 6A:
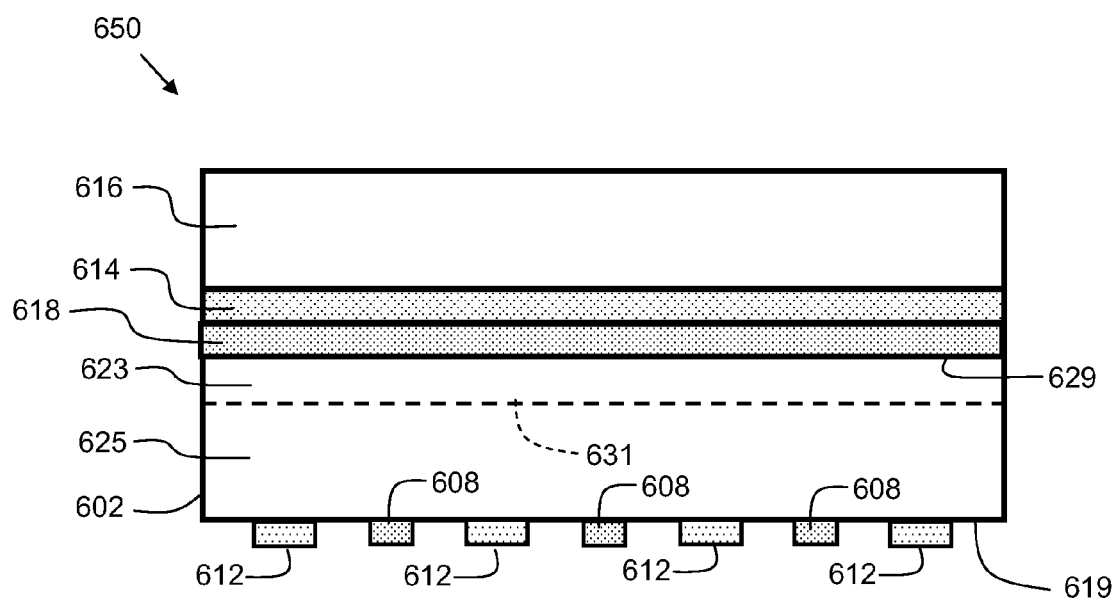

FIG. 6A shows an alternative embodiment of the present invention, showing solar cell 650. In this embodiment, the temperature of the SPC anneal is adjusted such that there is a small amount of diffusion from the deposited amorphous silicon into the silicon wafer as it crystallizes in order to establish the position of a diffusion "interface" 631 (which is the boundary between the diffused region 623 and undiffused region 625) to be below the top surface 629 of "bulk" silicon substrate 602. Top surface 629 is the growth surface on the substrate 602 for layer 618. Hence, diffusion interface 631 denotes a boundary of a diffused region 623 extending from front surface 629 to the diffusion interface 631 which is below front surface 629, but above back surface 619. To form the diffused region, the anneal temperature may be in the range of about 800 degrees Celsius to about 1100 degrees Celsius. The value of this diffused region 623 is that it reduces the potential influence of any defects located at the growth surface (physical interface) 629 between the silicon region 618 and the bulk silicon 602 by placing the electrical interface away from the growth surface (physical interface) 629.

Figure 7:
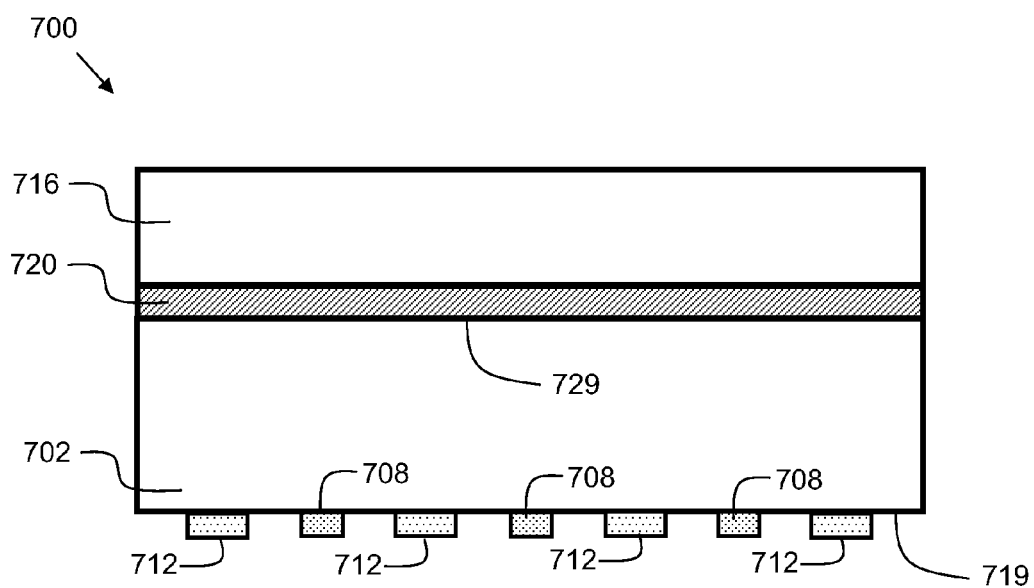

FIG. 7 shows another alternative embodiment of the present invention, showing solar cell 700. Solar cell 700 has similarities with solar cell 500 of FIG. 5, with a primary difference being amorphous silicon layer 720 used in place of dielectric passivation layer 514 (FIG. 5). In this embodiment, the amorphous silicon serves as a passivating material, and eliminates the need for a separate passivating layer (e.g. of oxide or nitride). This embodiment provides an advantage of a lower thermal budget, as the amorphous silicon layer 720 may be deposited via plasma-enhanced chemical vapor deposition (PECVD) at a temperature range of about 375 Celsius to about 450 Celsius, as compared with temperatures for oxide passivation layers, which may be considerably higher. In this embodiment, the amorphous silicon layer 720 is deposited after the SPC anneal, hence, allowing silicon layer 720 to remain amorphous, thereby acting as a passivation layer.

Figure 8:
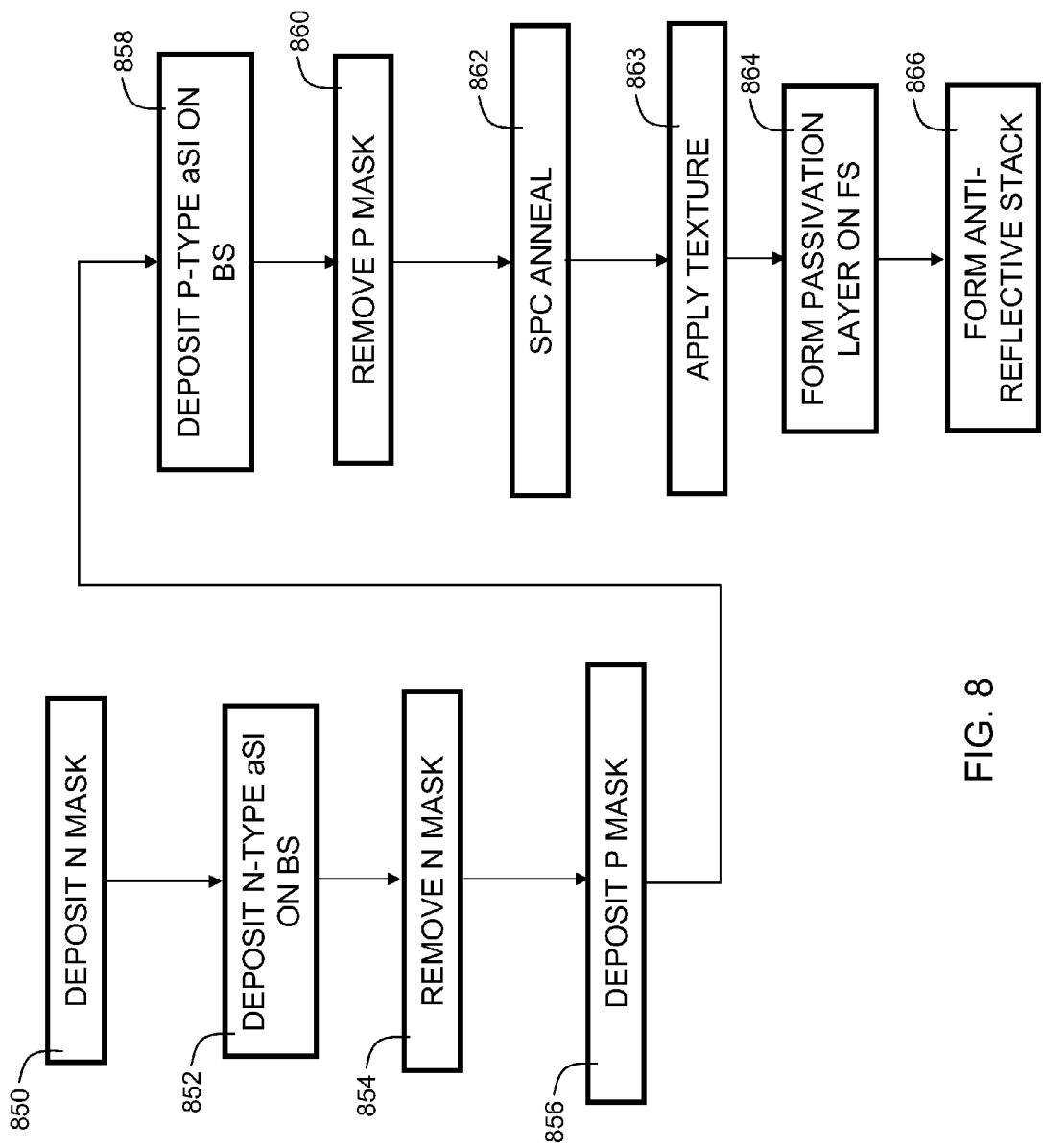

FIG. 8 is a flowchart indicating process steps for an embodiment of the present invention. In process step 850, an N mask layer is deposited for deposition of N-type amorphous silicon (see 104 of FIG. 1). In process step 852, an N-type amorphous silicon is deposited over the mask on the back surface (BS). In process step 854, the N mask layer is removed (see FIG. 2). In process step 856, a P mask layer is deposited for deposition of P-type amorphous silicon (see 310 of FIG. 3). In process step 858, a P-type amorphous silicon is deposited over the mask. In process step 860, the P mask layer is removed (see FIG. 4). In process step 862, a solid phase crystallization (SPC) anneal is performed. Optionally, in process step 863, a texture is applied to the front surface of the silicon substrate (see FIG. 5A). In process step 864, a passivation layer (see 514 of FIG. 5) is formed on the front surface (FS) of the silicon substrate. In one embodiment, the passivation layer may be comprised of a material including, but not limited to, silicon oxide, silicon nitride, or aluminum oxide. The thickness of the passivation layer may be in the range of about 30 angstroms to about 300 angstroms. In process step 866, an antireflective coating stack may optionally be formed over the passivation layer.

In another embodiment the passivation layer may be 700 to 1100 Angstroms thick and serve the function of both the passivating layer and anti-reflective layer, in which case step 866 would not be required. Alternately, the antireflection means may comprise one or more layers deposited on top of the passivation layer with thicknesses and refractive indices chosen to optimize anti-reflection properties.

Figure 9:
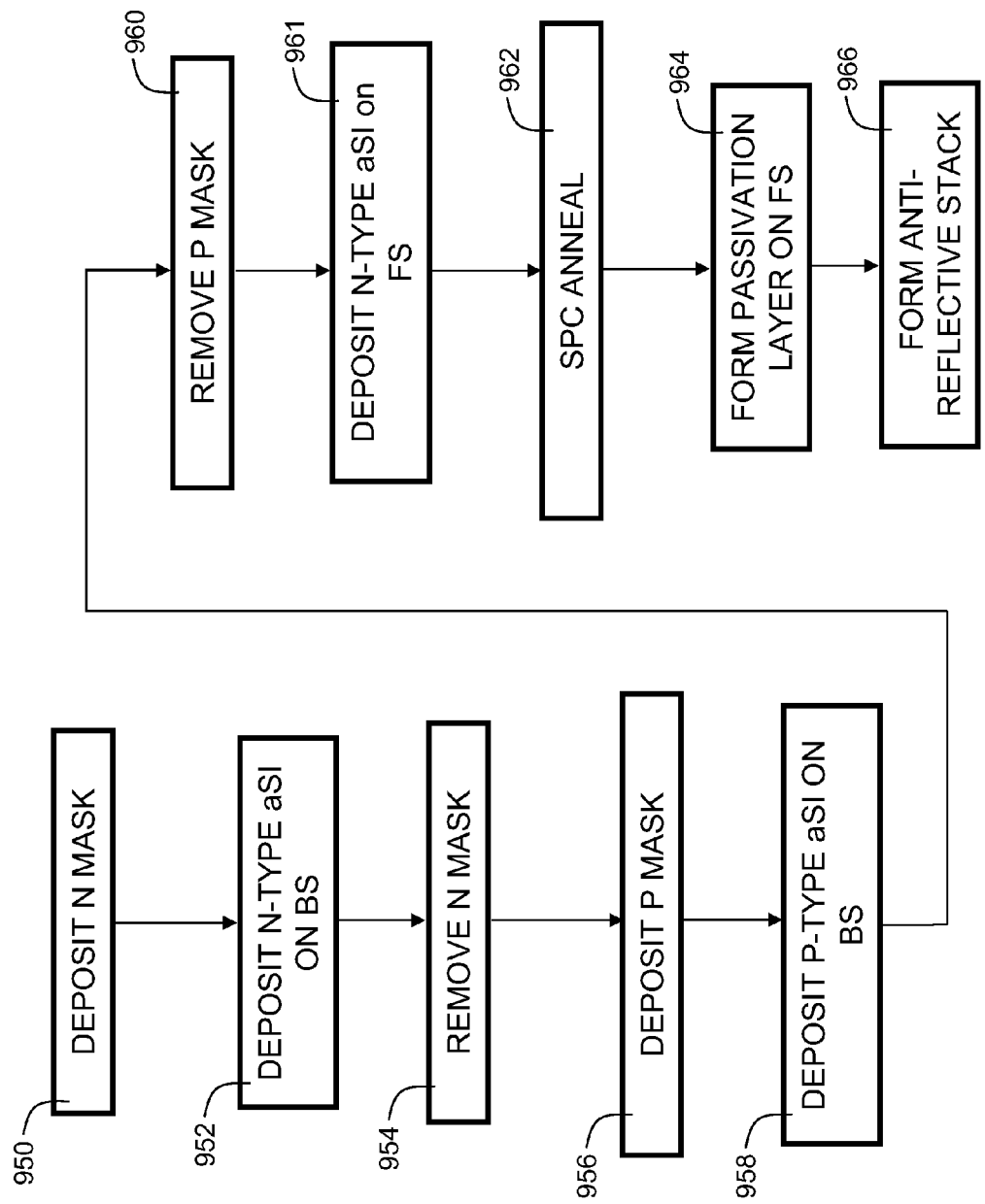

FIG. 9 is a flowchart indicating process steps for an alternative embodiment of the present invention. Process steps 950 to 960 are similar to process steps 850 to 860 as described for FIG. 8. In process step 961, a layer of amorphous silicon is deposited on the front surface of the silicon substrate (see 618 of FIG. 6). In process step 962, an SPC anneal is performed, converting the amorphous silicon deposited in steps 952, 958, and 961 into crystalline silicon. In process step 964, a passivation layer is formed on the crystalline silicon on the front surface of the silicon substrate. In process step 966, an antireflective coating stack may optionally be formed over the passivation layer.

FIG. 10 is a flowchart indicating process steps for another alternative embodiment of the present invention. Process steps 1050 to 1060 are similar to process steps 850 to 860 as described for FIG. 8. In process step 1062, an SPC anneal is performed. In process step 1065, a layer of amorphous silicon is deposited on the front surface of the silicon substrate (see 720 of FIG. 7). Since the layer of amorphous silicon is deposited after the SPC anneal, it remains amorphous, and does not become crystalline. The amorphous silicon serves as a passivation layer so no separate passivation layer step is needed. In process step 1066, an antireflective coating stack may optionally be formed over the passivation layer.

FIG. 11 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-7. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-7. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-7 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-7, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-7. Design structure 1690 may then proceed to a stage 1695 where, for example, design structure 1690: proceeds to tapeout, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a solar cell, comprising:
    depositing a first doped amorphous silicon layer on a first surface of a silicon substrate;
    depositing a second doped amorphous silicon layer on the first surface of the silicon substrate, wherein the second doped amorphous silicon layer is doped oppositely from the first doped amorphous silicon layer;
    depositing a third amorphous silicon layer on a second surface of the silicon substrate;
    performing an anneal to transform the first doped amorphous silicon layer into a first crystalline silicon layer, and transform the second doped amorphous silicon layer into a second crystalline silicon layer, and transform the third doped amorphous silicon layer into a third crystalline silicon layer; and
    depositing a passivation layer on the third doped amorphous silicon layer.

2. The method of claim 1, wherein performing the anneal comprises performing the anneal at a temperature in a range of about 575 degrees Celsius to about 900 degrees Celsius.

3. The method of claim 2, wherein the anneal is performed for a duration ranging from about 60 seconds to about 60 minutes.

4. The method of claim 1, wherein performing the anneal comprises performing the anneal at a temperature in a range of about 800 degrees Celsius to about 1100 degrees Celsius.

5. The method of claim 1, further comprising texturing the passivation layer.

6. The method of claim 1, wherein depositing the first doped amorphous silicon layer on the first surface of the silicon substrate and depositing the second doped amorphous silicon layer on the first surface of the silicon substrate is performed via plasma enhanced chemical vapor deposition.

7. The method of claim 1, further comprising depositing an antireflective coating stack on the passivation layer.

8. The method of claim 7, wherein depositing the antireflective coating stack comprises depositing titanium oxide.

9. The method of claim 1, wherein depositing the first doped amorphous silicon layer comprises depositing an amorphous silicon layer having a thickness ranging from about 0.1 microns to about 2.0 microns.

10. The method of claim 1, wherein depositing a first doped amorphous silicon layer comprises depositing an amorphous silicon layer having a doping level ranging from about 5E18 cm-3 to about 1E20 cm-3.

11. The method of claim 1, wherein depositing the passivation layer is performed via chemical vapor deposition.

12. The method of claim 1, wherein transforming the third amorphous silicon layer on the second surface of the silicon substrate into the third crystalline silicon layer comprises transforming the amorphous silicon layer to a polycrystalline silicon layer.

13. The method of claim 1, wherein transforming the third amorphous silicon layer on the second surface of the silicon substrate into the third crystalline silicon layer comprises transforming the amorphous silicon layer to a mono-crystalline silicon layer.

14. The method of claim 1, further comprising establishing a diffusion interface, wherein the diffusion interface is disposed below the second surface of the silicon substrate and above the first surface of the silicon substrate.

* * * * *